(12) United States Patent
Hong et al.

(10) Patent No.: US 11,264,543 B2
(45) Date of Patent: Mar. 1, 2022

(54) LIGHT CONVERSION FILM COMPRISING A QUANTUM DOT LAYER, BACKLIGHT UNITS FOR DISPLAY DEVICES INCLUDING THE LIGHT CONVERSION FILM, AND METHOD OF MANUFACTURING A QUANTUM DOT DISPERSION

(71) Applicants: SHIN-A T&C, Seoul (KR); UNIAM, Seoul (KR)

(72) Inventors: Seung Mo Hong, Incheon (KR); Jin Han Song, Seoul (KR); Hyeok Jin Hong, Suwon-si (KR); In Won Lee, Seoul (KR)

(73) Assignees: SHTN-A T & C, Seoul (KR); UNIAM, Seoul (KR)

( * ) Notice: Subject to any disclaimer, the term of this patent is extended or adjusted under 35 U.S.C. 154(b) by 41 days.

(21) Appl. No.: 16/922,467

(22) Filed: Jul. 7, 2020

(65) Prior Publication Data
US 2021/0013382 A1    Jan. 14, 2021

(30) Foreign Application Priority Data
Jul. 9, 2019    (KR) .......................... 10-2019-0082822

(51) Int. Cl.
*C09K 11/66* (2006.01)
*H01L 33/50* (2010.01)
*G02F 1/13357* (2006.01)

(52) U.S. Cl.
CPC ...... *H01L 33/504* (2013.01); *G02F 1/133603* (2013.01); *H01L 2933/0041* (2013.01)

(58) Field of Classification Search
CPC .. G02F 1/133614; C09K 11/883; B82Y 20/00
See application file for complete search history.

(56) References Cited

U.S. PATENT DOCUMENTS

| | | | |
|---|---|---|---|
| 2006/0068154 A1* | 3/2006 | Parce | C09D 11/037 428/76 |
| 2007/0034833 A1* | 2/2007 | Parce | B82Y 30/00 252/301.36 |
| 2010/0110728 A1* | 5/2010 | Dubrow | H01L 33/505 362/615 |
| 2015/0062967 A1 | 3/2015 | Bae et al. | |
| 2017/0162756 A1 | 6/2017 | Hartlove et al. | |

(Continued)

FOREIGN PATENT DOCUMENTS

| KR | 10-2015-0027343 A | 3/2015 |
|---|---|---|
| KR | 10-2017-0052729 A | 5/2017 |

(Continued)

*Primary Examiner* — Andrew J Coughlin
(74) *Attorney, Agent, or Firm* — Sughrue Mion, PLLC

(57) ABSTRACT

A light conversion film is disclosed. The light conversion film includes a first transparent support layer and a second transparent support layer are formed on upper and lower surfaces of a quantum dot layer, respectively. The quantum dot layer contains 0.4 to 2.0% by weight of quantum dot particles containing 5% by weight or more and less than 35% by weight of cadmium; 0.05 to 0.75% by weight of cadmium-free quantum dot particles; 0.1 to 10% by weight of scattering agent; and 75 to 98% by weight of matrix material, based on the total weight of the quantum dot layer. A backlight unit for a display device including the light conversion film is disclosed.

19 Claims, 1 Drawing Sheet

(56) References Cited

U.S. PATENT DOCUMENTS

| | | |
|---|---|---|
| 2017/0186922 A1 | 6/2017 | Kim et al. |
| 2017/0250322 A1 | 8/2017 | Wang et al. |
| 2018/0079953 A1 | 3/2018 | Shin et al. |
| 2019/0185743 A1 | 6/2019 | Kim et al. |
| 2019/0189863 A1 | 6/2019 | Choi et al. |
| 2019/0382658 A1 | 12/2019 | Nelson et al. |

FOREIGN PATENT DOCUMENTS

| | | |
|---|---|---|
| KR | 10-2017-0078553 A | 7/2017 |
| KR | 10-2018-0032108 A | 3/2018 |
| KR | 10-2018-0113606 A | 10/2018 |
| KR | 10-2018-0127431 A | 11/2018 |
| KR | 10-2019-0073301 A | 6/2019 |
| KR | 10-2019-0074869 A | 6/2019 |

* cited by examiner

[Fig. 1]
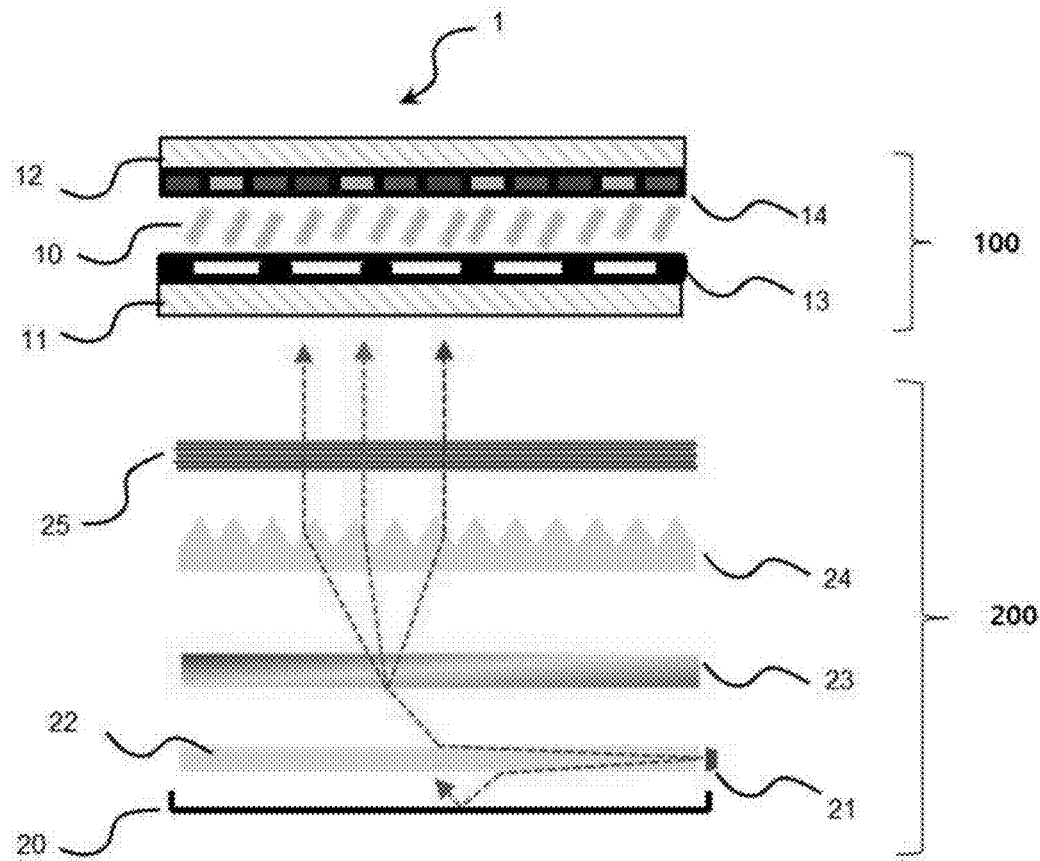
[Fig. 2]
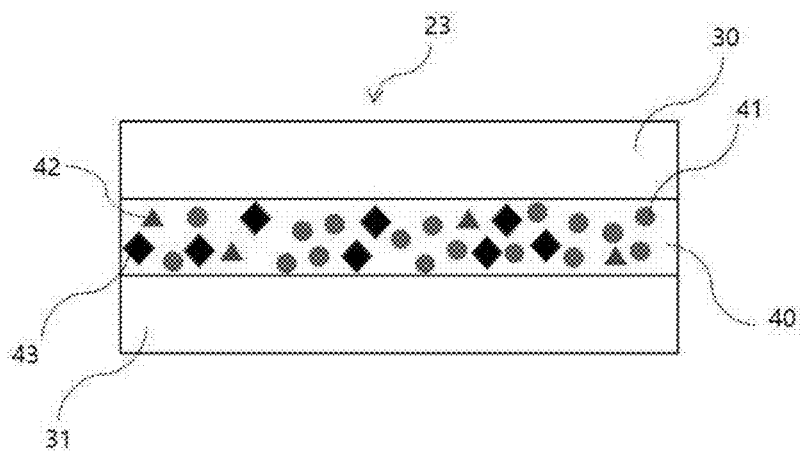

LIGHT CONVERSION FILM COMPRISING A QUANTUM DOT LAYER, BACKLIGHT UNITS FOR DISPLAY DEVICES INCLUDING THE LIGHT CONVERSION FILM, AND METHOD OF MANUFACTURING A QUANTUM DOT DISPERSION

CROSS REFERENCE TO RELATED APPLICATIONS

This is a non-provisional application which claims priority from Korean Patent Application No. 10-2019-0082822 filed on Jul. 9, 2019, the disclosure of which is incorporated herein in its entirety by reference.

TECHNICAL FIELD

The present invention relates to a light conversion film comprising a quantum dot layer, a backlight unit for a display device including the light conversion film, and a method of manufacturing a quantum dot dispersion.

BACKGROUND ART

Cadmium, which is a heavy metal substance, is the main culprit of soil, water quality, and air pollution, penetrates the human body through various foods connected to the food chain such as grains, vegetables, meat, and fish and shellfish, as well as contaminated drinking water, and is mixed with dust in the air, inhaled by respiratory action, and remains intact in the human body. As such, heavy metals that have penetrated the human body through various paths cause Itai-itai disease, which is a terrible pollution disease that destroys bone tissue and paralyzes muscles when severe, along with respiratory diseases, vomiting, fatigue, and helplessness, and even kills life at the end. Furthermore, heavy metals are highly residual, and when accumulated in the body tissue, there is a fear that they cause various harms without extracorporeal discharge. For this reason, the EU's Restriction of Hazardous Substances Directive (RoHS) restricts the use of six items of lead, cadmium, mercury, hexavalent chromium, phthalate, and bromine-based flame retardants in electronics or electrical equipment. These materials are suggested as 0.1% (1000 ppm) based on the weight of each material, in particular cadmium is more strictly limited to 0.01% (100 ppm).

Quantum Dots (QDs) are several nanoscale semiconducting nanoscale particles having quantum confinement effects, and exhibit excellent optical and electrical properties that general semiconducting materials do not have in the bulk state. Quantum dots can emit light when stimulated with energy such as light, and the color of light to be emitted varies according to the size of particles. In the case of utilizing such quantum dots, since a large-area high resolution display having good color purity, excellent color reproducibility, and good video characteristics can be implemented, a lot of researches on quantum dots are being conducted.

For example, cadmium-based quantum dot particles are actually commercialized and applied to backlight units (hereinafter, referred to as BLUs) in liquid crystal displays as light conversion film. However, among the quantum dot particles containing the cadmium, green-emitting quantum dot particles having a core of CdSe or CdS type and typically having a maximum absorption wavelength of 515 nm to 535 nm comprise 35 to 55% of cadmium, and red-emitting quantum dot particles having a relatively large particle size and a maximum absorption wavelength of 620 nm to 640 nm comprise 55 to 80% of cadmium. When the content of cadmium contained in the quantum dot is as high as described above, it is impossible to secure color purity and color reproducibility in the light conversion film for display by adjusting the cadmium content to an acceptable range.

In order to solve the above problems, U.S. Patent Application Laid-Open Publication No. US2017/0250322 A1 discloses a method of securing a relatively low concentration cadmium-containing quantum dot particles by coating a thick shell on a nanostructure having a core of CdSe. However, when the thick shell is formed, the optical density is lowered, so the quantum efficiency is lowered, and the particle size distribution of the quantum dot is widened, so a full width at half maximum (FWHM) is relatively large, and thus there are problems that low color purity and color reproducibility are lowered.

Indium phosphide (hereinafter referred to as InP)-based quantum dot particles, which have been studied a lot recently, are spotlighted due to their environmentally friendly properties. However, InP-based quantum dot particles have a full width at half maximum of 35 to 45 nm and a quantum efficiency of 70 to 85%, which have remarkably lowered characteristics compared to CdSe or CdS-based quantum dot particles having a full width at half maximum of 20 to 30 nm and a quantum efficiency of 85 to 95%, and are also susceptible to moisture and oxygen, thereby having a limitation that they cannot be applied alone to a light conversion film for a backlight unit of a display, in particular a liquid crystal display, or the like.

PRIOR ART DOCUMENT

Patent Document (Patent Document 1) U.S. Patent Application Laid-Open Publication No. US2017/0250322 A1

DISCLOSURE

Technical Problem

The present invention has been devised to solve the above problems of the prior arts, and an aspect of the present invention provides a light conversion film substantially having a cadmium content of 100 ppm or less while exhibiting excellent luminance and color reproduction properties, by securing the advantages of the quantum dot particles containing cadmium to the maximum.

Another aspect of the present invention provides a backlight unit for a display device and a display device that are safe and have excellent luminance and color reproduction properties by comprising the light conversion film.

Still another aspect of the present invention provides a method of efficiently manufacturing a quantum dot particle containing cadmium and a quantum dot particle dispersion used in the light conversion film.

Technical Solution

The present invention provides a light conversion film comprising a first transparent support layer formed on the upper surface of a quantum dot layer and a second transparent support layer formed on the lower surface thereof and having a thickness of 120 to 400 μm, wherein the quantum dot layer comprises 0.4 to 2.0% by weight of quantum dot particles containing 5% by weight or more and less than 35% by weight of cadmium; 0.05 to 0.75% by weight of cadmium-free quantum dot particles; 0.1 to 10% by weight of scattering agent; and 75 to 98% by weight of matrix material, based on the total weight of the quantum dot layer, and wherein the cadmium content in the film is 10 to 100 ppm.

In addition, the present invention provides a backlight unit for a display device comprising the light conversion film.

In addition, the present invention provides a display device comprising the backlight unit.

In addition, the present invention provides a composition for forming a quantum dot layer, wherein the quantum dot layer comprises:

(a) 0.4 to 2% by weight of cadmium-containing quantum dot particles having a cadmium (Cd) content of 5% by weight or more and less than 35% by weight;

(b) 0.05 to 0.75% by weight of cadmium-free quantum dot particles;

(c) 75 to 98% by weight of matrix material; and (d) 0.1 to 10% by weight of scattering agent.

In addition, the present invention provides a method of manufacturing a quantum dot particle dispersion, wherein the method comprises the steps of:

(a) reacting 0.1 to 4.5 moles of cationic precursor containing one or more selected from Groups II and III elements other than cadmium (Cd) with 0.5 to 6.0 moles of anionic precursor containing one or more selected from Groups V and VI elements, based on 1 mole of cationic precursor containing cadmium (Cd);

(b) separating and drying the particle produced in step (a) to prepare a quantum dot particle having a cadmium content of 5 to 35% by weight; and (c) dispersing the quantum dot particle having a cadmium content of 5 to 35% by weight in a solvent or a compound containing a double bond at a concentration of 1 to 20% by weight.

Advantageous Effects

The light conversion film of the present invention provides the effects that can substantially control the cadmium content to 100 ppm or less while exhibiting excellent luminance and color reproduction properties, by securing the advantages of the quantum dot particles containing cadmium to the maximum.

In addition, the present invention provides a backlight unit for a display device and a display device that are safe and have excellent luminance and color reproduction properties by comprising the light conversion film.

In addition, the present invention provides a method of efficiently manufacturing a quantum dot particle containing cadmium and a quantum dot particle dispersion used in the light conversion film.

DESCRIPTION OF DRAWINGS

FIG. 1 is a drawing schematically showing the structure of a liquid crystal display device, and FIG. 2 is a drawing schematically showing one embodiment of the light conversion films of the present invention.

BEST MODE

The present invention relates to a light conversion film comprising a first transparent support layer formed on the upper surface of a quantum dot layer and a second transparent support layer formed on the lower surface thereof and having a thickness of 120 to 400 μm, wherein the quantum dot layer comprises 0.4 to 2.0% by weight of quantum dot particles containing 5% by weight or more and less than 35% by weight of cadmium; 0.05 to 0.75% by weight of cadmium-free quantum dot particles; 0.1 to 10% by weight of scattering agent; and 75 to 98% by weight of matrix material, based on the total weight of the quantum dot layer, and wherein the cadmium content in the film is 10 to 100 ppm, more preferably 10 to 80 ppm, even more preferably 10 to 60 ppm.

In the quantum dot particles containing 5% by weight or more and less than 35% by weight of cadmium, when the cadmium content is less than 5% by weight, it is difficult to produce a quantum dot particle exhibiting sufficient color reproduction range and color purity, and when the cadmium content is 35% by weight or more, the cadmium content becomes high to cause an environmental problem, and thus it is not preferable. The cadmium content is more preferably 10 to 30% by weight.

The quantum dot particles containing 5% by weight or more and less than 35% by weight of cadmium have a maximum absorption wavelength of 525 to 540 nm, and the cadmium-free quantum dot particles have a maximum absorption wavelength of 625 to 640 nm. When the quantum dot layer comprises the quantum dot particles having the wavelength as described above, a green light conversion film having high color reproduction range and color purity while minimizing the cadmium content may be obtained.

It is preferable that the quantum dot particles containing 5% by weight or more and less than 35% by weight of cadmium have a full width at half maximum of 20 to 30 nm. When the full width at half maximum of the quantum dot particles is less than 20 nm, there are advantages in terms of color reproduction range and color purity, but it is not preferable in that the manufacturing is technically difficult, the yield decreases through an iterative purification process, and the amount of waste solvent generated is sharply increased, and thus economic efficiency is lowered, and when it is more than 30 nm, problems may occur that the color reproduction range and color purity are lowered.

In addition, it is preferable that the cadmium-free quantum dot particles have a full width at half maximum of 35 to 30 nm. When the full width at half maximum of the quantum dot particles is less than 35 nm, there are advantages in terms of color reproduction range and color purity, but it is not preferable in that the manufacturing is technically difficult, the yield decreases through an iterative purification process, and the amount of waste solvent generated is sharply increased, and thus economic efficiency is lowered, and when it is more than 50 nm, problems may occur that the color reproduction range and color purity are lowered.

The quantum dot particles containing 5% by weight or more and less than 35% by weight of cadmium are characterized by green light emission and preferably have an average particle diameter of 2 to 4 nm. If the average particle diameter is out of the above range, it is not characterized by green light emission.

The cadmium-free quantum dot particles are characterized by green light emission and preferably have an average particle diameter of 5 to 7 nm. If the average particle diameter is out of the above range, it is not characterized by red light emission.

The quantum dot particles containing 5% by weight or more and less than 35% by weight of cadmium contain 0.1 to 4.5 moles, more preferably 0.2 to 4 moles of one or more selected from Groups II and III elements other than cadmium and contain 0.5 to 6.0 moles, more preferably 1.0 to 5.0 moles of one or more selected from Groups V and VI elements, based on 1 mole of cadmium.

When the one or more selected from Groups II and III elements other than cadmium are contained in an amount less than the above range, the cadmium content may be high to occur environmental problems. and when they are contained in an amount more than the above range, color reproduction range and color purity of the quantum dot particles may not be guaranteed and quantum yield may be lowered.

When the one or more selected from Groups V and VI elements are contained in an amount less than the above range, there is a disadvantage that the storage stability of the quantum dot particles may be reduced to decrease the quantum efficiency over time, and when they are contained in an amount more than the above range. the stability may be guaranteed, but problems may arise that an initial quantum efficiency decreases and a full width at half maximum increases.

The one or more selected from Groups II and III elements other than cadmium may be selected from the group consisting of zinc (Zn), mercury (Hg), indium (In), magnesium (Mg), aluminum (Al), and the like, and, among them, zinc (Zn) may be preferably used.

The one or more selected from Groups V and VI elements may be selected from the group consisting of phosphorus (P), arsenic (As), nitrogen (N), sulfur (S), selenium (Se), tellurium (Te), and the like, and, among these, may be preferably selected from sulfur (S) and selenium (Se).

The cadmium-free quantum dot particles comprised in the quantum dot layer contain 0.2 to 4.0 moles of one or more selected from Groups V and VI elements, based on 1 mole of one or more selected from Groups II and III elements other than cadmium (Cd).

When the one or more selected from Groups V and VI elements are contained in an amount less than the above range, there is a disadvantage that the storage stability of the quantum dot particles may be reduced to decrease the quantum efficiency over time, and when they are contained in an amount more than the above range. the stability may be guaranteed, but problems may arise that an initial quantum efficiency decreases and a full width at half maximum increases.

The one or more selected from Groups II and III elements other than cadmium (Cd) may be selected from zinc (Zn), indium (In), and the like, and the one or more selected from Groups V and VI elements may be selected from sulfur (S), selenium (Se), tellurium (Te), phosphorus (P), and the like.

In particular, it may be preferably used that the one or more selected from Groups II and III elements other than cadmium (Cd) are preferably indium (In) and the one or more selected from Groups V and VI elements are phosphorus (P).

The quantum dot layer may have a cadmium content of 400 to 3000 ppm, more preferably 500 to 2600 ppm.

The quantum dot layer may have a thickness of 20 to 100 µm, preferably 40 to 80 µm. When the thickness of the quantum dot layer is less than the above range, it is difficult to express color purity and color reproduction range, and when it is more than the above range, there are problems that the cadmium content may is increased, the luminance may be reduced, and economic efficiency is lowered.

The light conversion film comprises a first transparent support layer formed on the upper surface of a quantum dot layer and a second transparent support layer formed on the lower surface thereof, and the first transparent support layer and the second transparent support layer may each independently have a thickness of 50 to 150 µm, more preferably 80 to 125 µm, even more preferably 80 to 100 µm. When the thicknesses of the first transparent support layer and the second transparent support layer are less than the above thickness, the quantum dot layer may not be sufficiently protected to continuously reduce the efficiency and color purity of the quantum dot, and the appearance of the film may be deteriorated by shrinkage during the curing process required to form the quantum dot layer, and when they are more than the above range, the total transmittance may be reduced to decrease the quantum dot efficiency of the quantum dot light conversion film, the total thickness of the liquid crystal display may be increased, and economic efficiency may be lowered.

The light conversion film may have a luminance of 700 $cd/m^2$ or more, preferably 730 $cd/m^2$ or more, and more preferably 750 $cd/m^2$ or more.

The light conversion film may have a color reproduction range of 100% or more, preferably 110% or more, and more preferably 115% or more.

As the light conversion film of the present invention, it may be more preferable to use a light conversion film comprising a first transparent support layer formed on the upper surface of a quantum dot layer and a second transparent support layer formed on the lower surface thereof and having a thickness of 200 to 280 µm, wherein the quantum dot layer has a thickness of 40 to 80 µm, wherein the first transparent support layer and the second transparent support layer each independently has a thicknesses of 80 to 100 µm, wherein the cadmium content in the film is 10 to 60 ppm, and wherein the film has a luminance of 760 $cd/m^2$ or more and a color reproduction range of 115% or more.

The matrix material comprises one or more (meth)acrylate-based compounds and one or more photoinitiators.

As the (meth)acrylate-based compound, one or more selected from the group consisting of a (meth)acrylated monomer, an urethane (meth)acrylate oligomer, a polyester (meth)acrylate oligomer, an epoxy (meth)acrylate oligomer, and the like may be used.

The matrix material may further comprise a polythiol-based compound.

The content about the matrix material will be described in more detail below.

In addition, the present invention relates to a backlight unit for a display device comprising the light conversion film.

The backlight unit for a display device may comprise a light guide plate, a reflection plate disposed under the light guide plate, a plurality of light-emitting elements disposed on one side of the light guide plate, a light conversion film disposed on the upper of the light guide plate, and a luminance enhancement film disposed on the upper of the light conversion film.

The light-emitting element may be a blue light-emitting diode.

The backlight unit for the display device will be described in more detail below.

In addition, the present invention relates to a display device comprising the display unit.

The display device is not particularly limited, but may be a liquid crystal display device. The display device will be described in more detail below.

In addition, the present invention relates to a composition for forming a quantum dot layer, wherein the quantum dot layer comprises:

(a) 0.4 to 2% by weight of cadmium-containing quantum dot particles having a cadmium (Cd) content of 5% by weight or more and less than 35% by weight;

(b) 0.05 to 0.75% by weight of cadmium-free quantum dot particles;

(c) 75 to 98% by weight of matrix material; and (d) 0.1 to 10% by weight of scattering agent.

The contents about the quantum dot layer as described above may be applied to the contents of the present invention constituting the composition for forming the quantum dot layer in all applicable ranges.

The matrix material may preferably comprise one or more (meth)acrylate-based compounds, a polythiol-based compound, and one or more photoinitiators.

The matrix material may preferably comprise 30 to 70 parts by weight of (meth)acrylate-based compound, 10 to 50 parts by weight of polythiol-based compound, and 1 to 6 parts by weight of one or more photoinitiators.

The composition for forming the quantum dot layer may have a cadmium content of 400 to 3000 ppm, more preferably 500 to 2600 ppm.

As the (meth)acrylate-based compound, one or more selected from the group consisting of isobonyl (meth)acrylate, ethylhexyl (meth)acrylate, lauryl (meth)acrylate, octyldecyl (meth)acrylate, isooctyl (meth)acrylate, trimethylcyclohexyl (meth)acrylate, isodecyl (meth)acrylate, stearic (meth)acrylate, tricyclodecane dimethanol di(meth)acrylate, and the like may be used.

It may be more preferably used that (a) the quantum dot particles having a cadmium (Cd) content of 5% by weight or more and less than 35% by weight are green light-emitting particles and have a maximum absorption wavelength of 525 to 540 nm, a full width at half maximum of 20 to 30 nm, and a quantum yield of 90% to 99%, and (b) the cadmium-free quantum dot particles are red light-emitting particles and have a maximum absorption wavelength of 625 to 640 nm, a full width at half maximum of 35 to 50 nm, and a quantum yield of 70% to 85%.

The composition for forming a quantum dot layer will be described in more detail below.

In addition, the present invention relates to a method of manufacturing a quantum dot particle containing 5% by weight or more and less than 35% by weight of cadmium, wherein the method comprises the steps of:

(a) reacting 0.1 to 4.5 moles of cationic precursor containing one or more selected from Groups II and III elements other than cadmium (Cd) with 0.5 to 6.0 moles of anionic precursor containing one or more selected from Groups V and VI elements, based on 1 mole of cationic precursor containing cadmium (Cd); and (b) separating the particle produced in step (a).

In addition, the present invention relates to a method of manufacturing a quantum dot particle dispersion, wherein the method comprises the steps of:

(a) reacting 0.1 to 4.5 moles of cationic precursor containing one or more selected from Groups II and III elements other than cadmium (Cd) with 0.5 to 6.0 moles of anionic precursor containing one or more selected from Groups V and VI elements, based on 1 mole of cationic precursor containing cadmium (Cd);

(b) separating and drying the particle produced in step (a) to prepare a quantum dot particle having a cadmium content of 5 to 35% by weight; and (c) dispersing the quantum dot particle having a cadmium content of 5 to 35% by weight in a solvent or a compound containing a double bond at a concentration of 1 to 20% by weight.

The cadmium content in the quantum dot particle dispersion is preferably 0.1 to 7.0% by weight.

The contents to be described below may be applied to the method of manufacturing the quantum dot particle and the method of manufacturing the quantum dot particle dispersion as described above.

As the cationic precursor containing cadmium (Cd), one or more selected from the group consisting of dimethyl cadmium, diethyl cadmium, cadmium oxide, cadmium carbonate, cadmium acetate dihydrate cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate, and cadmium oleate may be used.

The precursor containing one or more selected from Groups II and III elements other than cadmium (Cd) may be added to the reaction at 0.1 to 4.5 moles, preferably 0.2 to 4.0 moles. When the addition amount of the cationic precursor containing one or more selected from Groups II and III elements other than cadmium (Cd) is less than the above range, the cadmium content may be high to occur environmental problems. and when it is more than the above range, color reproduction range and color purity of the quantum dot particles may not be guaranteed and quantum yield may be lowered.

The anionic precursor containing one or more selected from Groups V and VI elements may be added to the reaction at 0.5 to 6.0 moles, preferably 1.0 to 4.0 moles. When the anionic precursor containing one or more selected from Groups V and VI elements is added in an amount less than the above content, a problem may arise that the storage stability of the quantum dot particles may be reduced to decrease the quantum efficiency over time, and when it is added in an amount more than the above content. the stability may be guaranteed, but problems may arise that an initial quantum efficiency decreases and a full width at half maximum increases.

The manufacturing method will be described in detail below.

<Display Device>

The liquid crystal display device will be described below with an example.

FIG. 1 is a drawing schematically showing the structure of a liquid crystal display device 1. The liquid crystal display device 1 includes a liquid crystal display panel 100, a pair of polarizing films 11 and 12 disposed one above and one below the liquid crystal display panel 100, and a backlight unit 200.

The liquid crystal display panel 100 includes a lower display panel 13, an upper display panel 14, and a liquid crystal layer 10 sandwiched between the both display panels 13 and 14. The lower display panel 13 may include a transparent substrate, a thin film transistor formed on the substrate through a thin film process and switching a voltage applied to a pixel electrode, a pixel electrode connected to the thin film transistor, and the like. The upper display panel 14 may include a transparent substrate, a light shielding layer and a color filter formed on the transparent substrate, a planarization film formed to cover the light shielding layer and the color filter, a common electrode formed to cover the planarization film, and the like. The pixel electrode is formed at a position corresponding to each color filter.

The backlight unit 200 includes a light conversion layer that converts blue light or ultraviolet light into white light, including a light-emitting element and a quantum dot that emit blue light or ultraviolet light. The backlight unit 200 serves as a light source for supplying light to the liquid crystal display device.

The light supplied from the backlight unit 200 is linearly polarized by the lower polarizing film 11, and the phase of the linearly polarized light is selectively changed while passing through the liquid crystal layer 10. The light passing through the liquid crystal layer 10 is filtered to red, green, and blue lights while passing through the color filter to reach the upper polarizing film 12, and the amount of light transmitting the upper polarizing film 12 varies according to the degree of phase change in the liquid crystal layer 10. The amount of light transmitting the upper polarizing film 12 may be controlled by adjusting a voltage applied to each pixel electrode, and thus, the light quantity of each of the red, green, and blue transmitting the upper polarizing film 12 may be independently controlled. The liquid crystal display device may display a color image through such processes. In this case, the color gamut displayed by the liquid crystal display device is determined according to the color purity of the red light, green light, and blue light component of the white light supplied by the backlight unit 200. That is, since red light, green light, and blue light are extracted and used for display by filtering the white light supplied by the backlight unit 200 with the color filter, when the color purity of the red light, the green light, and the blue light included in the white light supplied by the backlight unit 200 is high, the colors that can be displayed by the liquid crystal display device are diversified, and thus a wide color gamut can be displayed.

The white light supplied by the backlight unit 200 includes a red light component, a green light component, and a blue light component. By passing the white light supplied by the backlight unit 200 through a red filter, a green filter, and a blue filter to extract a red component, a green component, and a blue component, respectively, and drawing a triangle whose position on the color coordinate corresponding to each color component is a vertex, the triangular color gamut defined above can be obtained. When the spectrum is measured in a state in which the backlight unit 200 is combined with the liquid crystal display panel 100 to form a liquid crystal display device, the measurement may be performed using a color filter formed in the liquid crystal display panel 100.

The red spectrum can be obtained by measuring the spectrum in a state in which only the red pixel of the liquid crystal display device turned on and the remaining pixels turned off, the green spectrum can be obtained by measuring the spectrum in a state in which only the green pixel turned on and the remaining pixels turned off, and the blue spectrum can be obtained by measuring the spectrum in a state in which only the blue pixel turned on and the remaining pixels turned off. Alternatively, the spectrum of the white light emitted by the backlight unit 200 may be measured by using a spectrometer, and the position on the color coordinate of each color component may be calculated using the peak wavelength and the full width at half maximum of the measured spectrum. Wherein since the blue light component is generally light emitted by the blue light-emitting diode, it may be determined according to the characteristics of the blue light-emitting diode and there may be little room for change. Therefore, there is an advantage that only the characteristics of the red light component and the green light component may be considered.

The backlight unit 200 may comprise a light guide plate 22, a reflection plate 20 disposed under the light guide plate 22, a light-emitting element 21 disposed on one side of the light guide plate 22, and a light conversion film 23 disposed on the upper of the light guide plate 22. In addition, a luminance enhancement film 24 and a reflective polarizer 25 may be included on the light conversion film 23. The light guide plate 22 serves to move the light (point light source) generated from the light-emitting element 21 to the front surface of the backlight to convert it into a surface light source. As the light guide plate 22, an inclined type light guide plate having a thickness gradually decreasing in the opposite direction from the vicinity of the light-emitting element 21 or a general type light guide plate having the same thickness may be selectively used, and the light guide plate 22 may be manufactured in the melt extrusion method by selecting a polymer composite having a high transmittance and excellent heat resistance, for example, polymethyl methacrylate resin (PMMA), polycarbonate resin (PC), polyethylene terephthalate resin (PET), or the like. In addition, the a reflection plate 20 disposed under the light guide plate 22 may be used to reduce light loss by serving to reflect the light that has escaped to the lower part of the backlight among the light emitted from the light-emitting element 21 and raise it upward. As described above, as the light-emitting element 21, a blue light-emitting diode may be preferably used, and the blue light-emitting diode has the advantage that a part of the light is converted into a red light component and a green light component while passing through the light conversion film 23, thereby increasing color purity. The light passing through the light conversion film 23 may pass through the luminance enhancement film 24 to increase luminance. The luminance enhancement film 24 serves to condense light by producing a cured layer having a high refractive index on the transparent support layer in a prism shape, and may increase energy efficiency.

<Light Conversion Film>

FIG. 2 is a drawing schematically showing one embodiment of the light conversion films 23 of the present invention. In the present invention, the light conversion film 23 may be, for example, a quantum dot layer formed in the first transparent support layer 30 and the second transparent support layer 31, but is not limited thereto. The quantum dot layer 40 is characterized in that it is manufactured by curing a material consisting of a mixture of a matrix material 40, which is a curable material, quantum dot particles 41 containing 5% by weight or more and less than 35% by weight of cadmium, cadmium-free quantum dot particles 42, and a scattering agent 43. The total thickness of the light conversion film 23 may be determined according to the thickness of the first transparent support layer, the second transparent support layer, and the quantum dot layer. It may preferably be 120 to 400 μm, more preferably 150 to 350 μm. When it is more than the above range, the thickness of the backlight unit may be thick to cause limitations in design, and the transmittance may be reduced to lower the overall luminance, and when it is less than the above range, the durability may be lowered to make it difficult to continuously maintain the light conversion role, or deformation may occur due to heat generated from the backlight unit to cause wrinkles to be recognized or distortion of the display screen. Hereinafter, the components of the light conversion film of the present invention will be described.

(1) First Transparent Support Layer and Second Transparent Support Layer

As a first transparent support layer and a second transparent support layer, a substrate in the form of a film is used that require high transparency and are excellent in heat resistance. The substrate in the form of the film may be, for example, a film containing a resin, such as polyester such as poly(meth)acrylate, polyethylene terephthalate (PET), polybutylene terephthalate (PBT), polyethylene naphthalate (PEN), and polyarylate; polycarbonate, polyvinyl chloride, polyethylene, polypropylene, polystyrene, aliphatic or aromatic polyamide (for example, nylon, aramid, and the like), polyether ether ketone, polysulfone, polyethersulfone, polyimide, polyamideimide, polyetherimide, cyclic olefin polymer (COP), polyvinylidene chloride, and the like, but is not limited thereto.

In addition, as the first transparent support layer and the second transparent support layer, a substrate in the form of a film having a separate surface treatment may be used. Since nano-scale quantum dots are susceptible to external factors such as moisture or oxygen to have a short lifespan, when the quantum dot layer is applied to a light-emitting diode or a quantum dot light conversion film, it is important to maintain a passivation layer on the surface of the quantum dot to ensure the efficiency and color purity of the quantum dot. Therefore, in addition to the first transparent support layer and the second transparent support layer, a barrier film (coating) may be further formed to protect the quantum dots of the quantum dot layer from an external environment (for example, moisture or oxygen). Examples of the barrier film (coating) include a deposited metal oxide layer formed by sputtering or the like.

(2) Quantum Dot Layer

In the present invention, the quantum dot layer may be manufactured, for example, by coating the composition for forming the quantum dot layer on at least one surface of the first transparent support layer or the second transparent support layer, laminating the first transparent support layer or the second transparent support layer, and then curing them with heat or ultraviolet light, and the composition for forming the quantum dot layer may include the following (A) to (D):

(A) quantum dot particles containing 5% by weight or more and less than 35% by weight of cadmium;

(B) cadmium-free quantum dot particles;

(C) a matrix material; and (D) a scattering agent having a particle size of 0.01 to 10 μm.

The composition for forming the quantum dot layer may be prepared by uniformly dispersing through a known mixing process. The compounds of (A) to (D) may be mixed at a stirring speed of 100 to 1000 rpm in a dispersion equipment equipped with an Intensive Type with Teeth (ITT) Dispersion Blade to remove the large particles using a filter, preferably a filter made of Teflon, of 5 microns or less.

A dispersant may be further added to disperse the particles in the composition for forming the quantum dot layer and minimize the amount of large particles. As the dispersant, one or more from the group consisting of a commercially available dispersant, for example, DisperBYK-111, DisperBYK-110, DisperBYK-161, DisperBYK-162, DisperBYK-170, DisperBYK-181, DisperBYK-2000, DisperBYK-2009, and DisperBYK-2200 from BYK-Chemie GmbH; WET-250, WET-260, WET-270, and WET-280 from Evonik Industries AG; Efka® PU 4010, Efka® PU 4015, Efka® PU 4046, Efka® PU 4050, Efka® PU 4055, Efka® PU 4063, Efka® PU 4080, Efka® PX 4300, Efka® PX 4330, Efka® PX 4350, and Efka® PX 4700 from BASF Group may be purchased and used.

It is preferable to use by dispersing (A) the quantum dot particles containing 5% by weight or more and less than 35% by weight of cadmium and (B) the cadmium-free quantum dot particles, which are used in the composition for forming the quantum dot layer, in an amount of 1 to 20% by weight in a solvent or a compound containing a double bond. The quantum dot particles are preferably obtained by a purification method through precipitation using a non-solvent. However, when the particles are stored in a dry state, there is a problem that the stability is reduced to lower the quantum yield, and when the dried quantum dots are directly added to the composition for forming the quantum dot layer, since quantum dot particles may aggregate to make it difficult to secure a desired quantum yield or full width at half maximum, a problem arises that input of quantum dot particles is increased. In order to solve such problems, the present invention proposes to disperse the dried quantum dot particles in a solvent or a compound containing a double bond in an amount of 1 to 20% by weight to store it and to apply it to the composition for forming the quantum dot layer. The quantum dot particles used in the present invention may include a saturated or unsaturated aliphatic compound containing aliphatic alkyl (wherein the alkyl is a straight or branched chain having the number of carbon atoms indicated below) on the surface, and it is preferable to disperse it in a hydrophobic solvent or a compound containing a hydrophobic double bond in order to disperse it. As the hydrophobic solvent, aromatic hydrocarbon solvents such as benzene, toluene, and xylene, and aliphatic hydrocarbon solvents such as hexane, heptane, and octane are preferable. However, when the quantum dot particles dispersed in the solvent are mixed with the composition for forming the quantum dot layer, the solvent must be subsequently removed through a separate process for removing the solvent, for example, a high temperature reduced pressure distillation process or the like, so that the composition for forming the quantum dot layer does not cause problems such as adhesion, appearance, and luminance of the light conversion film after the curing process.

Therefore, in order to avoid the process of removing the solvent through high temperature reduced pressure distillation process or the like, it is preferable to disperse the quantum dot particles preferably using a compound containing a hydrophobic double bond, for example, a hydrophobic (meth)acrylate-based compound as a compound capable of curing reaction with the matrix layer.

It may be dispersed in one or more selected from the group consisting of isobonyl (meth)acrylate, ethylhexyl (meth)acrylate, lauryl (meth)acrylate, octyldecyl (meth)acrylate, isooctyl (meth)acrylate, trimethylcyclohexyl (meth)acrylate, isodecyl (meth)acrylate, stearic (meth)acrylate, tricyclodecane dimethanol di(meth)acrylate, and the like, as the hydrophobic (meth)acrylate-based compound.

A quantum dot layer having a thickness of 20 to 100 μm, preferably 40 to 80 μm may be formed through a curing process of the composition for forming the quantum dot layer. The thickness of the quantum dot layer may be adjusted by the input of the composition for forming the quantum dot layer, the viscosity of the composition for forming the quantum dot layer, and the lamination pressure applied when the first transparent supporting layer or the second transparent supporting layer is laminated.

(2-1) Quantum Dot Particle

A quantum dot can include a core, a shell, and a ligand. The quantum dot, for example, may have a size of about 10 nm or more and may have a high quantum efficiency in proportion thereto.

The core may have a substantially spherical three-dimensional shape at the center of the quantum dot, and may include at least one cation and at least one anion. The cation may include Group II or III elements, for example, cadmium (Cd), zinc (Zn), and indium (In). The anion may include Group V or VI elements, and may include, for example, sulfur (S), selenium (Se), tellurium (Te), and/or phosphorus (P). Accordingly, the core may be a binary core containing CdSe, CdTe, CdS, ZnSe, ZnTe, InP, or the like, a ternary core containing ZnCdS, ZnSeTe, CdSeS, ZnCdSe, ZnCdTe, or the like, or a quaternary core containing ZnCdSeS, ZnCdSeTe, ZnCdTeS, or the like.

On the other hand, the core may exhibit a variety of colors depending on its composition ratio, that is, the content of the cation and/or the anion. Accordingly, the quantum dots may have various emission colors such as blue, red, and green. Representatively, the quantum dot may be a blue quantum dot or a green quantum dot.

The shell may substantially surround the surface of the core and may include at least one cation and at least one anion. The cation may include, for example, Group II elements such as zinc (Zn) and cadmium (Cd). The anion may include, for example, Group VI elements such as sulfur (S) and selenium (Se). The shell may be a binary shell containing ZnS, ZnSe, or the like, or a ternary shell containing ZnCdS, ZnCdSe, or the like. The shell may have a layered gradient composition. That is, the shell may have different anion content and/or different cation content from its innermost layer to its outermost layer. For example, when the shell comprises zinc (Zn), cadmium (Cd), and sulfur (S), the zinc (Zn) concentration inside the shell may be substantially lowest in its innermost layer and may be substantially highest at its outermost layer. That is, the zinc (Zn) concentration inside the first shell may increase substantially as it moves away from the core. The shell may have a constant composition, for example, the cation content and/or the anion content uniform from its innermost layer to its outermost layer. On the one hand, the quantum dot may further include a second shell substantially surrounding it on the surface of the shell. In this case, the size of the quantum dot may be further increased, and in particular, the bond between electrons and holes inside the core may be further protected. In addition, the quantum dot can thus have a higher quantum efficiency, which can be maintained continuously.

The ligand may include, for example, an organic functional group, and may be chemically bound to the shell surface by the organic functional group. However, it is not limited thereto. The ligand may be introduced to the surface of the quantum dot particles by a ligand exchange reaction of a compound containing Group II elements used in the shell manufacturing process, and the structure of the organic functional group in the ligand is closely related to compatibility with the matrix resin.

(2-2) Quantum Dot Particle containing 5% by Weight or more and less than 35% by Weight of Cadmium The quantum dot having a cadmium content of 5% by weight or more and less than 35% by weight may be prepared using at least one cationic precursor and at least one anionic precursor.

The at least one cationic precursor may include 0.1 to 4.5 moles, preferably 0.2 to 4.0 moles of precursor containing one or more selected from Groups II and III elements other than cadmium (Cd), based on 1 mole of cationic precursor containing cadmium (Cd).

When the content of the cationic precursor containing one or more selected from Groups II and III elements other than cadmium (Cd) is used less than the above range, the cadmium content may be high to occur environmental problems, and when it is used more than the above range, color reproduction range and color purity of the quantum dot particles may not be guaranteed and quantum yield may be lowered.

The one or more selected from Groups II and III elements may be selected from, for example, zinc (Zn), mercury (Hg), indium (In), magnesium (Mg), aluminum (Al), and the like, and the use of zinc (Zn) may be desirable in terms of core manufacture and physical properties of the core.

The cationic precursor containing cadmium (Cd) may include dimethyl cadmium, diethyl cadmium, cadmium oxide, cadmium carbonate, cadmium acetate dihydrate cadmium acetylacetonate, cadmium fluoride, cadmium chloride, cadmium iodide, cadmium bromide, cadmium perchlorate, cadmium phosphide, cadmium nitrate, cadmium sulfate, cadmium carboxylate, cadmium oleate, and the like, and one or more may be selected and used therefrom.

As the cationic precursor containing one or more selected from Groups II and III elements other than cadmium (Cd), one or more selected from the group consisting of zinc acetate, dimethyl zinc, diethyl zinc, zinc carboxylate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, zinc oleate, mercury iodide, mercury bromide, mercury fluoride, mercury cyanide, mercury nitrate, mercury perchlorate, mercury sulfate, mercury oxide, mercury oxide, mercury carbonate, mercury carboxylate, aluminum phosphate, aluminum acetylacetonate, aluminum chloride, aluminum fluoride, aluminum oxide, aluminum nitrate, aluminum sulfate, gallium acetylacetonate, gallium chloride, gallium fluoride, gallium oxide, gallium nitrate, gallium sulfate, indium chloride, indium oxide, indium nitrate, indium sulfate, indium acetate, indium carboxylate, and precursor compounds based on these precursors may be used.

The one or more selected from Groups II and III elements may be used to prepare a cationic precursor through a ligand exchange reaction to form an appropriate precursor. Compounds that can be used as the ligand include, for example, monovalent alkyl carboxylic acid compounds, wherein the alkyl may be a straight or branched, saturated or unsaturated aliphatic compound having the number of carbon atoms indicated below. The alkyl is alkyl having 5 to 25 carbon atoms, and may be more preferably alkyl having 10 to 20 carbon atoms. Specifically, one or more selected from the group consisting of lauric acid, palmitic acid, tridecylic acid, myristic acid, steric acid, pentadecylic acid, oleic acid, and the like may be used.

The ligand exchange reaction may consist of a method comprising, for example, the steps of: mixing Groups II and/or III elements and the alkyl carboxylic acid compound and melting the mixture (90 to 120° C.); heating the melted mixture to perform a ligand exchange reaction (140 to 170° C.); and removing by-products generated by the ligand exchange reaction.

The at least one anionic precursor may be an anionic precursor including one or more selected from Groups V and VI elements. Specifically, the Group V elements may be, for example, phosphorus (P), arsenic (As), nitrogen (N), or the like, and the Group VI elements may be, for example, sulfur (S), selenium (Se), tellurium (Te), or the like.

Group V cationic precursors containing Group V elements may be one or more selected from the group consisting of alkyl phosphine, tris(trialkylsilyl phosphine), tris(dialkylsilyl phosphine), and tris(dialkylamino phosphine), arsenic oxide, arsenic chloride, arsenic sulfate, arsenic bromide, arsenic iodide, nitric oxide, nitric acid, ammonium nitrate, and the like.

In addition, As Group VI cationic precursors containing Group VI elements, one or more selected from the group consisting of sulfur, trioctylphosphine sulfide, trialkylphosphine sulfide, trialkenylphosphine sulfide, alkylamino sulfide, alkenylamino sulfide, alkylthiol, sulfur trioctylphosphine selenide, trialkylphosphine selenide, trialkenylphosphine selenide, alkylamino selenide, alkenylamino selenide, trialkylphosphine telluride, trialkenylphosphine telluride telluride), alkylamino telluride, alkenylamino telluride, and the like, and precursor compounds based on these precursors may be used.

In the present invention, the cadmium-containing quantum dot may be manufactured by a method comprising the steps of:

(a) producing a solution comprising a core including at least one cationic precursor and at least one anionic precursor;

(b) producing a compound to be used in a shell, which comprises an organic solvent and a particle comprising at least some of the elements constituting the cationic precursor and the anionic precursor included in the core; and (c) injecting a solution comprising the produced core into a solution comprising a compound to be used in a high-temperature shell to form a quantum dot particle.

More specifically, the method comprises the steps of: preparing a first solution comprising at least one cationic precursor and a second solution comprising at least one anionic precursor; mixing the first solution and the second solution to produce a solution comprising a core; producing a solution comprising a compound to be used in a shell, which comprises an organic solvent and a particle comprising at least some of the elements constituting the cationic precursor and the anionic precursor included in the core; gradually heating the solution comprising the compound to be used in the shell to 200 to 350° C.; and injecting the solution comprising a core into the heated solution comprising the compound to be used in the shell within 0.1 to 5 minutes.

Hereinafter, each step will be described in more detail.

A first solution comprising at least one cationic precursor and a second solution comprising at least one anionic precursor are prepared. In this case, the first solution comprises at least two or more precursors, that is, one or more cationic precursor containing cadmium (Cd) among Group II elements and one or more precursor containing one ore more selected from Groups II and III elements other than cadmium (Cd).

As the first solution, 0.1 to 4.5 moles, preferably 0.2 to 4.0 moles of precursor containing one or more selected from Groups II and III elements other than cadmium (Cd), based on 1 mole of cationic precursor containing cadmium (Cd) may be used to control the content of cadmium (Cd) in the quantum dot particles. The first solution may comprise two or more cationic precursors, including a cationic precursor containing cadmium (Cd), and the second solution may also comprise two or more anionic precursors, but is not limited thereto. In one or more selected from Groups II and III elements other than cadmium (Cd) in the cationic precursor, the Group II elements may be selected from zinc (Zn), mercury (Hg), and the like, and the Group III elements may be selected from indium (In), magnesium (Mg), aluminum (Al), and the like. In particular, as one or more selected from Groups II and III elements, zinc (Zn) may be preferably used.

The anionic precursor may be an precursor including one or more selected from Groups V and VI elements. Specifically, the Group V elements may be selected from phosphorus (P), arsenic (As), nitrogen (N), and the like, and the Group VI elements may be selected from sulfur (S), selenium (Se), tellurium (Te), and the like.

In order to form a suitable cationic precursor, the step of preparing the first solution may comprising the steps of: mixing a first cationic precursor, a second cationic precursor, and a saturated/unsaturated fatty acid, and then heating the mixture; removing by-products in vacuo; and performing a ligand exchange reaction.

In one embodiment of the present invention, to prepare a first solution comprising zinc oleate and cadmium oleate, the step of mixing zinc acetate, cadmium oxide, and oleic acid, and heating the mixture to 100 to 160° C.; the step of performing a ligand exchange reaction at 140 to 180° C.; and the step of removing a low molecular weight acid generated by the ligand exchange reaction, at high vacuum, may be carried out.

Next, the first solution and the second solution are mixed to produce a solution comprising the core. Specifically, the reaction of the first solution comprising the cationic precursor and the second solution comprising the anionic precursor may proceed at 200 to 400° C. More preferably, the reaction may proceed at 250 to 350° C. The composition ratio of the first solution and the second solution in the mixed solution may be appropriately adjusted according to the emission wavelength of the quantum dot to be finally formed. For example, the molar ratio of the first solution and the second solution may be 1:4 to 4:1, but is not limited thereto.

Upon producing a mixed solution comprising the core, an organic solvent may be used. As the organic solvent, those that can mix the cationic precursor of the first solution and the anionic precursor of the second solution are used. Such an organic solvent may be any one of primary alkylamines having 6 to 22 carbon atoms, such as hexadecylamine; secondary alkylamines having 6 to 22 carbon atoms, such as dioctylamine; tertiary alkylamines having 6 to 40 carbon atoms, such as trioctylamine; nitrogen-containing heterocyclic compounds, such as pyridine; aliphatic hydrocarbons (alkanes, alkenes, alkynes, and the like) having 6 to 40 carbon atoms, such as hexadecane, octadecane, octadecene, and squalene; aromatic hydrocarbons having 6 to 30 carbon atoms, such as phenyldodecane, phenyl tetradecane, phenyl hexadecane; phosphines substituted with alkyl groups having 6 to 22 carbon atoms, such as trioctylphosphine; phosphine oxides substituted with alkyl groups having 6 to 22 carbon atoms, such as trioctylphosphine oxide; aromatic ethers having 12 to 22 carbon atoms, such as phenyl ether and benzyl ether; and combinations thereof, but is not limited thereto.

The organic solvent is preferably a high boiling point solvent which is low in vapor generation and stable even after a water removal process under reduced pressure at about 100 to 150° C. followed by heating at 200 to 350° C.

Through the reaction, elements of the cationic precursor and the anionic precursor are combined to form quantum dots having an alloy form. In the method of manufacturing the quantum dot of the present invention, since at least one of the first solution comprises two or more precursors, and the second solution comprises at least one precursor, a core of a quantum dot particle including three or more elements in total is formed. The quantum dot produced by the manufacturing method of the present invention may have a single core shape including three or more elements such as Zn—Cd—S, Zn—Cd—Se, and Zn—Cd—S—Se, but is not limited thereto. In this case, the optical density, the full width at half maximum, and the like may vary depending on the amount of the precursor containing Cd. Finally, the product formed from the core is cooled and purified. Specifically, the product which the quantum dot has been formed through the reaction step is first cooled to room temperature, and then purified and washed to obtain a core of the quantum dot particle having the desired purity. The purification may comprise the step of adding a non-solvent to the product to separate the core of the quantum dot particle. Non-solvent is a polar solvent that is mixed with the organic solvent used in the reaction but cannot disperse quantum dots, and may include acetone, ethanol, butanol, isopropanol, ethanediol, water, tetrahydrofuran (THF), dimethyl sulfoxide (DMSO), diethyl ether, formaldehyde, and the like, but is not limited thereto. In addition, the purification may comprise the step of separating the quantum dot through methods such as centrifugation, precipitation, chromatography, or distillation.

The core alloy may secure sufficient stability without including a separate shell structure, but may include a shell structure depending on the conditions of use or the maximum emission spectrum determined by the particle size. However, it is not essential.

In order to manufacture a quantum dot having a core-shell structure, a manufacturing method comprising a stepwise synthesis process may be used to firstly form a core, and then secondarily form a shell.

In the shell formation, the cationic precursor and the anionic precursor, which were used to constitute the core, may be used at the same time. The cationic precursor may be preferably a compound that does not contain a cadmium (Cd) element. When a compound containing a cadmium (Cd) element is used, the cadmium (Cd) content of the quantum dot particle increases to cause environmental problems. Although the precursor containing Group II or III elements other than cadmium (Cd), for example, zinc (Zn), mercury (Hg), indium (In), magnesium (Mg), or aluminum (Al) may be used in the same manner as in the core manufacturing, it is preferable to use a precursor containing zinc (Zn) in consideration of the properties and manufacturing ease of the quantum dot particle. The cationic precursor may be produced through a ligand exchange reaction in the same manner as in the core manufacturing. The step of mixing a cationic precursor and a saturated/unsaturated fatty acid, and then heating the mixture, the step of removing by-products in vacuo, and a ligand exchange reaction may be further comprised.

The anionic precursor may be a precursor containing one or more selected from Groups V and VI elements in the same manner as in the core manufacturing. Specifically, the Group V elements may be selected from phosphorus (P), arsenic (As), nitrogen (N), or the like, and the Group VI elements may be selected from sulfur (S), selenium (Se), tellurium (Te), and the like.

The cationic precursor and the anionic precursor may be simultaneously added to form a shell structure in the form of an alloy, or may be separately added to give a gradient to the shell, but is not limited thereto.

Although a ligand capable of improving compatibility with the matrix material through the ligand exchange reaction may be further introduced into the quantum dot particle surface of the produced core or core/shell structure, ligands of the cationic precursors used in the producing the core and shell may bind to the surface of the quantum dot particles, and thus it is not an essential process. This may be appropriately changed through the ligand exchange reaction depending on the matrix material, or the quantum dot particle may be produced without a separate ligand exchange process after the shell process.

Cadmium-containing nanoparticles having a cadmium content of 5% by weight or more and less than 35% by weight produced by the above method may preferably be in the form of CdS/ZnS, CdSe/ZnSe, CdS/ZnSe, CdS/CdSe/ZnS, CdS/CdSe/ZnSe, CdSe/ZnS/ZnSe, CdS/ZnS/ZnSe, and CdS/CdSe/ZnS/ZnSe alloys, but is not limited thereto.

The quantum dot particles containing cadmium may be nanoparticles having a maximum absorption wavelength of maximum emission at a green wavelength of 525 to 540 nm, a full width at half maximum of 20 to 30 nm, and a quantum yield of 90% to 99%. The quantum dot particles in the wavelength range is relatively small in particle size to reduce the amount of cadmium to the minimum, and since the quantum dot particles in the wavelength range need to be added to the quantum dot particles in a relatively large amount, there is a advantage that the minimum full width at half maximum and high quantum yield, which are advantages of the quantum dot particles containing cadmium, can be reflected to the maximum.

In the present invention, the quantum dot particles containing 5% by weight or more and less than 35% by weight of cadmium may be included in an amount of 0.4 to 2 parts by weight, preferably 0.6 to 1.5 parts by weight, and even more preferably 0.7 to 1.0 parts by weight, based on 100 parts by weight of the pre-cured composition of the entire quantum dot layer. When it is less than the above range, the color reproduction range and the color purity are lowered, and when it is more than the above range, the cadmium (Cd) content may be increased and economic efficiency may be lowered.

(2-3) Cadmium-Free Quantum Dot Particle

The cadmium-free quantum dot particle may include at least one cation and at least one anion. The cation may include one or more selected from Groups II and III elements other than cadmium (Cd), and may include, for example, zinc (Zn) and/or indium (In), and the like. The anion may include one or more selected from Groups V and VI elements, for example, may include sulfur (S), selenium (Se), tellurium (Te), and/or phosphorus (P), and may be produced by a method similar to the method of manufacturing cadmium-containing nanoparticles having a cadmium content of 5% by weight or more and less than 35% by weight, except that a cationic precursor containing a cadmium atom is excluded. The cadmium-free quantum dot particles are preferably quantum dot particles in the form of InP/ZnS, InP/ZnSe, and InP/ZnS/ZnSe alloys, but are not limited thereto.

The cadmium-free quantum dot particles may be nanoparticles having a photoluminescence spectrum of maximum emission in the red wavelength range of 625 to 640 nm, a full width at half maximum of 35 to 50 nm, and a quantum yield of 75% to 85%. Since the quantum dot particles in the wavelength range is relatively large in particle size, the amount of cadmium is relatively increased when manufactured in the form of cadmium, and thus it is not preferable to use quantum dot particles containing cadmium. In addition, since the quantum dot particles in the wavelength range is added to the quantum dot layer in a relatively small amount, even when using cadmium-free quantum dot particles, it is possible to minimize the problems of high full width at half maximum and low quantum yield, which are disadvantages of such quantum dots.

The cadmium-free quantum dot particles may be included in an amount of 0.05 to 0.75 parts by weight, preferably 0.10 to 0.45 parts by weight, and even more preferably 0.15 to 0.35 parts by weight, based on 100 parts by weight of the pre-cured composition of the entire quantum dot layer. When it is the above range or less, the color reproduction range and the color purity are lowered, and when it is the above range or more, economic efficiency may be lowered.

(2-4) Matrix Material

The matrix material may be used regardless as long as it is compatible with the quantum dot particles of the core-shell structure and is a liquid composition. The matrix material may be included in an amount of 75 to 98% by weight, preferably 88 to 98% by weight, based on the total weight of the quantum dot layer.

The liquid composition is a resin which is curable by ultraviolet rays or heat, and preferably a resin which may be present as a matrix of a solid quantum dot layer after curing. In particular, an UV curable composition may be preferable in consideration of processability or process convenience. The ultraviolet curable composition may include a (meth)acrylate-based compound, a photoinitiator, and an antioxidant in a molecule. In addition, a polythiol-based compound may be used to accelerate the curing property and reduce the curing shrinkage.

The (meth)acrylate-based compound may be one more selected from the group consisting of a (meth)acrylated monomer, a urethane (meth)acrylate oligomer, a polyester (meth)acrylate oligomer, an epoxy (meth)acrylate oligomer, and the like, but is not limited thereto, and any (meth)acrylate-based compound commonly used in the art may be used without limitation.

The (meth)acrylated monomer may be prepared by ester condensation of an aliphatic alcohol with a (meth)acrylic acid. Depending on the number of aliphatic alcohols, it may be mono-, bi-, tri-, tetra-, penta- or hexa-functional (meth)acrylate monomer. As representative examples thereof, (meth)acrylic acid, ethylene glycol di(meth)acrylate, ethoxylated bisphenol A di(meth)acrylate ester, isosorbide di(meth)acrylate, tris(2-hydroxyethyl)isocyanurate tri(meth)acrylate and di(meth)acrylate, alkyl (for example. isobornyl, isodecyl, isobutyl, n-butyl, tert-butyl, methyl, ethyl, tetrahydrofurfuryl, cyclohexyl, n-hexyl, isooctyl, 2-ethylhexyl, n-lauryl, octyl, or decyl) ester of acrylic acid or methacrylic acid, hydroxy alkyl (for example, 2-hydroxyethyl and hydroxy propyl) ester (meth)acrylate, phenoxyethyl(meth)acrylate, nonylphenol ethoxylate mono(meth)acrylate, 2-(2-ethoxyethoxy)ethyl (meth)acrylate, 2-butoxyethyl (meth)acrylate, butylene glycol di(meth)acrylate and tri(meth)acrylate, 1,6-hexanediol di(meth)acrylate, ethoxylated and/or propoxylated hexanediol di(meth)acrylate, ethoxylated bisphenol A diacrylate, sorbitol di(meth)acrylate, glycerol tri(meth)acrylate and ethoxylated and/or propoxylated derivatives thereof, bisphenol A di(meth)acrylate and ethoxylated and/or propoxylated derivatives thereof, tricyclodecane di(meth)acrylate, tricyclodecane dimethanol di(meth)acrylate, pentaerythritol di(meth)acrylate and tri(meth)acrylate and tetra(meth)acrylate and ethoxylated and/or propoxylated derivatives thereof, ethylene glycol di(meth)acrylate, diethylene glycol di(meth)acrylate, triethylene glycol di(meth)acrylate, tetraethylene glycol di(meth)acrylate, propylene glycol di(meth)acrylate, tripropylene glycol di(meth)acrylate, tetramethylene glycol di(meth)acrylate, neopentyl glycol di(meth)acrylate, ethoxylated and/or propoxylated neopentyl glycol di(meth)acrylate, hexamethylene glycol di(meth)acrylate, 4,4'-bis(2-acryloyloxyethoxy)diphenylpropane, trimethylolpropane di(meth)acrylate, trimethylolpropane tri(meth)acrylate and ethoxylated and/or propoxylated derivatives thereof, dipentaerythritol tetra(meth)acrylate and penta(meth)acrylate and hexa(meth)acrylate and ethoxylated and/or propoxylated derivatives thereof, and the like may be used.

Moreover, the urethane (meth)acrylates generally have 2 to 15 (meth)acrylate functional groups. The urethane (meth)acrylates are generally obtained from the reaction of one or more polyisocyanates, one or more (meth)acrylate functional groups containing one or more (generally one) reactive groups that can react with isocyanate groups, and optionally one or more compounds containing two or more reactive groups that can react with isocyanate groups. The reactive groups that can react with isocyanate groups are generally hydroxyl groups. As examples thereof, products such as Miramer® PU240, Miramer® PU256, Miramer® PU2100, Miramer® UA5095, Miramer® PU3200, Miramer® PU3210, Miramer® PU330, Miramer® PU340, Miramer® PU370, Miramer® PU3410, Miramer® PU664, Miramer® SC2100, Miramer® SC2153, Miramer® SC2152 (hereinbefore, Miwon Specialty Chemical Co., Ltd.), EBECRYL® 4883, EBECRYL® 9384, EBECRYL® 1290, EBECRYL 220® (hereinbefore, Alex Co., Ltd.), UV-3510TL, UV3000B, UV3310B, UV-7510B, UV-7600B, UV-1700B (hereinbefore, Nippon Kosei Co., Ltd.) may be purchased and used selectively.

In addition, the polyester (meth)acrylates may be generally obtained from ester reactions of one or more polyols with one or more (meth)acrylic acids. The acrylic acid and methacrylic acid are preferably used alone or in combination. Suitable polyester (meth)acrylates may be, for example, aliphatic or aromatic polyhydric polyols that are fully esterified with (meth)acrylic acid and may contain residual hydroxyl functional groups in the molecule, and an easy and suitable way to characterize a product is to determine its hydroxyl value (mg KOH/g). Suitable are partial or total esterification products of (meth)acrylic acid with di- to hexa-valent polyols or mixtures thereof. In addition, reaction products of polyols as described above with ethylene oxides and/or propylene oxides or mixtures thereof, or reaction products of polyols as described above with lactones and lactides may be used. As examples thereof, products such as Miramer® PS420, Miramer® PS430, Miramer® PS460, Miramer® PS610 (hereinbefore, Miwon Specialty Chemical Co., Ltd.), EBECRYL® 870, EBECRYL® 657, EBECRYL® 450, EBECRYL® 800, EBECRYL® 884, EBECRYL® 885, EBECRYL® 810, EBECRYL® 830 (hereinbefore, Alex Co., Ltd.) may be purchased and used selectively.

In addition, the epoxy (meth)acrylates are generally obtained from the reaction of one or more polyepoxy compounds with one or more (meth)acrylic acids. The acrylic acid and methacrylic acid are preferably used alone or in combination. Examples of suitable epoxy (meth)acrylate oligomers may be di(meth)acrylates of diglycidyl ethers of bisphenol A, and variants thereof, for example, EBECRYL® 3700 or EBECRYL® 600, EBECRYL® 3701, EBECRYL® 3703, EBECRYL® 3708, EBECRYL® 3720 and EBECRYL® 3639 (hereinbefore, Alex Co., Ltd.), Miramer® PE210, Miramer® PE2120A, Miramer® PE250 (hereinbefore, Miwon Specialty Chemical Co., Ltd.).

The photoinitiator may include one or more acylphosphine oxide-based photoinitiator and one or more photoinitiator other than the acylphosphine oxide-based photoinitiator. The acylphosphine oxide-based photoinitiator may be selected from the group consisting of bis(2,4,6-trimethylbenzoyl)-phenylphosphine oxide, 2,4,6-tribenzoyldiphenylphosphine oxide, ethyl-2,4,6-triethylbenzoylphenylphosphinate, and the like. In addition, the photoinitiator other than the acylphosphine oxide-based photoinitiator may be selected from, for example, α-hydroxyalkylphenone-based photoinitiator, α-aminoalkylphenone-based photoinitiator, benzoin ether-based photoinitiator, α,α-dialkoxyacetophenone-based photoinitiator, phenylglyoxylate-based photoinitiator, and the like. The α-hydroxyalkylphenone-based, α-aminoalkylphenone-based, benzoin ether-based, and α,α-dialkoxyacetophenone-based photoinitiators may be one or more selected from the group consisting of 1-hydroxycyclohexyl phenyl ketone, 2-hydroxy-2-methyl-1-phenyl-1-propanone, 2-hydroxy-1-[4-(2-hydroxyethoxy), α,α-dimethoxy-α-phenylacetophenone, 2-benzyl-2-(dimethylamino)-1-[4-(4-morpholinyl)phenyl]-1-butanone, methylbenzoylformate, a mixture of oxy-phenyl-acetic acid 2-[2-oxo-2-phenyl-acetoxy-ethoxy]-ethyl ester and oxy-phenyl-acetic acid 2-[2-hydroxy-ethoxy]-ethyl ester, and the like.

The polythiol-based compound is a compound having two or more thiol functional groups, and a compound having one ester functional group per thiol functional group may be preferably used. As the compound having one ester functional group per thiol functional group, for example, one or more selected from the consisting of ethylene glycol dimercaptoacetate, trimethylolpropane trimercaptoacetate, pentaerythritol tetramercaptoacetate, dipentaerythritol hexamercaptoacetate, ethylene glycol di(3-mercaptopropionate), trimethylolpropane tri(3-mercaptopropionate), dipentaerythritol hexa(3-mercaptopropionate), ethoxylated trimethylolpropane tri(3-mercaptopropionate), tris[2-(3-mercaptopropionyloxy)ethyl]isocyanurate, polycaprolactone tetra (3-mercaptopropionate), pentaerythritol tetrakis(3-mercaptobutylate), 1,4-bis(3-mercaptobutyryloxy)butane, 1,3,5-tris(3-mercaptobutyloxyethyl)-1,3,5-triazine-2,4,6 (1H, 3H, 5H)-trione, trimethylolpropane tris(3-mercaptobutyrate), and the like may be used.

(2-5) Scattering Agent

The scattering agent is included in the amount of 0.1 to 10 parts by weight based on 100 parts by weight of the quantum dot layer, and serves to scatter the light entering the quantum dot layer to increase the light path, thereby increasing the contact chance of the light and the quantum dot particles to improve the light conversion rate. When the amount of the scattering agent is less than the above range, the scattering is lowered to make the light conversion rate insufficient, and when it is more than the above range, the haze becomes high and the transmittance is low to make it impossible to secure sufficient luminance.

The scattered particle (E) may be one or more selected from the group consisting of silica, alumina, silicon, titanium dioxide ($TiO_2$), zirconia ($ZrO_2$), barium sulfate, zinc oxide (ZnO), poly(methylmethacrylate) (PMMA), a benzoguanamine-based polymer, and the like. In addition, it may be preferably used to have an average particle diameter of 0.01 to 10 nanometers.

In the present invention, "%" means "% by weight" unless otherwise specified. In addition, the concentration unit such as ppm means "w/w" concentration unless otherwise specified.

Hereinafter, the present invention will be specifically described through examples. However, the following examples are provided only for illustrating the present invention more clearly, and are not intended to limit the scope of the present invention. The scope of the present invention will be defined by the technical spirit of the claims to be described below.

Synthesis Example 1

Synthesis of Cadmium-Containing Green Light-Emitting Quantum Dot Particles (Cd-G1)

4 mmol of zinc acetate, 1 mmol of cadmium oxide, 10 ml of oleic acid, and 15 ml of dehydrated 1-octadecene (1-ODE) under reduced pressure at 120° C. for 30 minutes as a solvent were placed in a reactor and reacted at 160° C. for 2 hours in an argon atmosphere, and then acetic acid, a by-product generated during the reaction under reduced pressure of $10^{-2}$ torr was removed to produce a first solution comprising cadmium oleate (Cd-OA) and zinc oleate (Zn-OA).

Separately, 0.5 mmol of selenium, 4 mmol of sulfur, and 2 mmol of trioctylphosphine were placed in a reactor and reacted at 100° C. for 1 hour to produce a second solution comprising sulfur trioctylphosphine selenide (Se-TOP) and sulfur trioctylphosphine sulfide (S-TOP), and then the second solution was added to the produced first solution, and a mixture of the first solution and the second solution was heated up to 300° C. and reacted for 2 hours. Thereafter, the mixture was cooled to room temperature, precipitated with acetone, and then centrifuged using a complex solvent including hexane and ethanol, and dispersed in IBXA (Isobornyl Acrylate; Osaka Organic Chemical Industry Ltd.) so that the concentration was 10% using a UV-VIS equipment to obtain a quantum dot particle dispersion of the alloy form comprised of selenium-sulfur-zinc-cadmium.

In this case, the Cd content measured by ICP-MS for 10% concentration of the quantum dot particle dispersion of Synthesis Example 1 above was 7,495 ppm (7.5% by weight of particle-only cadmium content by conversion calculation), the maximum absorption wavelength measured by Quantaurus-QY (C11347-11; Hamamatsu Photonics K.K.) was 531.5 nm, the full width at half maximum (FWHM) was 25 nm, and the quantum yield (%, internal) measured by QE-2000 (Otsuka Electronics Co., Ltd.) was 90.5%.

Synthesis Example 2

Synthesis of Cadmium-Containing Green Light-Emitting Quantum Dot Particles (Cd-G2)

It was manufactured in the same manner as in Synthesis Example 1 except that 2 mmol of zinc acetate and 3 mmol of cadmium oxide were used.

In this case, the Cd content measured by ICP-MS for 10% concentration of the quantum dot particle dispersion of Synthesis Example 2 above was 22,761 ppm (22.8% by weight of particle-only cadmium content by conversion calculation), the maximum absorption wavelength measured by Quantaurus-QY (C11347-11; Hamamatsu Photonics K.K.) was 530.5 nm, the full width at half maximum (FWHM) was 23 nm, and the quantum yield (%, internal) measured by QE-2000 (Otsuka Electronics Co., Ltd.) was 93.9%.

Synthesis Example 3

Synthesis of Cadmium-Containing Green Light-Emitting Quantum Dot Particles (Cd-G3)

It was manufactured in the same manner as in Synthesis Example 1 except that 1 mmol of zinc acetate and 4 mmol of cadmium oxide were used.

In this case, the Cd content measured by ICP-MS for 10% concentration of the quantum dot particle dispersion of Synthesis Example 3 above was 31,645 ppm (31.6% by weight of particle-only cadmium content by conversion calculation), the maximum absorption wavelength measured by Quantaurus-QY (C11347-11; Hamamatsu Photonics K.K.) was 530.0 nm, the full width at half maximum (FWHM) was 21 nm, and the quantum yield (%, internal) measured by QE-2000 (Otsuka Electronics Co., Ltd.) was 96.8%.

Commercial Product 1: Cadmium-Containing Green Light-Emitting Quantum Dot Particles (Cd-G4)

Commercially available cadmium-type green light-emitting particles (trade name: SQD-CG100H02, manufacturer: Uniam Co, Ltd., IBXA 10% dispersion) were purchased and used. The Cd content measured by ICP-MS for 10% concentration of the quantum dot particle dispersion was 49,684 ppm (49.6% by weight of particle-only cadmium content by conversion calculation), the maximum absorption wavelength measured by Quantaurus-QY (C11347-11; Hamamatsu Photonics K.K.) was 522.8 nm, the full width at half maximum (FWHM) was 20 nm, and the quantum yield (%, internal) measured by QE-2000 (Otsuka Electronics Co., Ltd.) was 97.6%.

Commercial Product 2: Cadmium-Containing Red Light-Emitting Quantum Dot Particles (Cd-R1)

Commercially available cadmium-type red light-emitting particles (trade name: SQD-CR100H01, manufacturer: Uniam Co, Ltd., IBXA 10% dispersion) were purchased and used. The Cd content measured by ICP-MS for 10% concentration of the quantum dot particle dispersion was 67,982 ppm (67.9% by weight of particle-only cadmium content by conversion calculation), the maximum absorption wavelength measured by Quantaurus-QY (C11347-11; Hamamatsu Photonics K.K.) was 620.0 nm, the full width at half maximum (FWHM) was 21 nm, and the quantum yield (%, internal) measured by QE-2000 (Otsuka Electronics Co., Ltd.) was 97.1%.

Commercial Product 3: Cadmium-Free Green Light-Emitting Quantum Dot Particles (InP-G1)

Commercially available non-cadmium-type green light-emitting particles (trade name: SQD-FG100H03, manufacturer: Uniam Co, Ltd., IBXA 10% dispersion) were purchased and used. The Cd content measured by ICP-MS for 10% concentration of the quantum dot particle dispersion was N.D (Not Detect), the maximum absorption wavelength measured by Quantaurus-QY (C11347-11; Hamamatsu Photonics K.K.) was 534.0 nm, the full width at half maximum (FWHM) was 39 nm, and the quantum yield (%, internal) measured by QE-2000 (Otsuka Electronics Co., Ltd.) was 76.5%.

Commercial Product 4: Cadmium-Free Red Light-Emitting Quantum Dot Particles (InP-R1)

Commercially available non-cadmium-type red light-emitting particles (trade name: SQD-FR100H07, manufacturer: Uniam Co, Ltd., IBXA 10% dispersion) were purchased and used. The Cd content measured by ICP-MS for 10% concentration of the quantum dot particle dispersion was N.D (Not Detect), the maximum absorption wavelength measured by Quantaurus-QY (C11347-11; Hamamatsu Photonics K.K.) was 620.0 nm, the full width at half maximum (FWHM) was 40 nm, and the quantum yield (%, internal) measured by QE-2000 (Otsuka Electronics Co., Ltd.) was 75.5%.

TABLE 1

| Manufacturing method | Cd-G1 Synthesis Example 1 | Cd-G2 Synthesis Example 2 | Cd-G3 Synthesis Example 3 | Cd-G4 Commercial Product 1 | Cd-R1 Commercial Product 2 | InP-G1 Commercial Product 3 | InP-R1 Commercial Product 4 |
|---|---|---|---|---|---|---|---|
| Cd content (%) | 7.5 | 22.8 | 31.6 | 49.6 | 67.9 | 0.0 | 0.0 |
| Maximum absorption wavelength (nm) | 531.5 | 530.5 | 530.0 | 522.8 | 620.2 | 534.1 | 623.9 |
| Full width at half maximum (nm) | 25 | 23 | 21 | 20 | 21 | 39 | 40 |
| Quantum yield (%) | 90.5 | 93.9 | 96.8 | 97.6 | 97.1 | 76.5 | 75.5 |

Preparation Example 1

Manufacture of Composition for Forming Quantum Dot Layer 30 parts by weight of M300 (trimethylpropane triacrylate; Miwon Specialty Chemical Co., Ltd.), 20 parts by weight of IBXA (isoborneol acrylate: Osaka Yuki Kayaku), 30 parts by weight of PEMP (pentaerythritol tetrakis (3-mercaptopropionate); SC Organic Chemical Co., Ltd.), 6 parts by weight of zinc oxide (FINEX 30, 35 nm of average particle diameter; Sakai Chemical Industry Co., Ltd.), 2 parts by weight of 1-hydroxy-cyclohexyl-phenyl-ketone (Igacure 184; IGM Co., Ltd.), 2 parts by weight of 2,4,6-tribenzoyldiphenylphosphine oxide (Darocure TPO; IGM Co., Ltd.), 8 parts by weight of green light-emitting quantum dot particle dispersion of each of Synthesis Examples 1 to 3 and Commercial Products 1 and 2, and 2 parts by weight of red light-emitting quantum dot particle dispersion of each of Commercial Products 2 and 5 were added in a combination according to the following Table 2 below and high-speed stirred at a stirring speed of 500 rpm in a dispersion equipment equipped with an Intensive Type with Teeth (ITT) Dispersion Blade, and then pressurization-filtered with a 1 um Teflon filter, and bubbles in the resin were completely removed under reduced pressure for 30 minutes to produce a composition for forming a quantum dot layer.

Preparation Example 2

Manufacture of Light Conversion Film Comprising Quantum Dot Layer

Coating of each of composition for forming the quantum dot layer produced in Preparation Example 1 on the first transparent support layer was performed using a micro bar, and the second transparent support layer was laminated thereon using a rubber roll so as not to generate bubbles, and then UV curing was carried out. In this case, a UV curing system (UVMH1001; Lichtzen Co., Ltd.) equipped with a metal halide lamp was used as the ultraviolet curing equipment, and the light quantity in the UVA region measured using UV Puck II (EIT Co., Ltd.) was 1500 mJ. In this case, the thicknesses of the green light-emitting quantum dot particles, the red light-emitting quantum dot particles, the first transparent support layer, the second transparent support layer, and the quantum dot layer are shown in the Examples and the Comparative Examples of Table 2 below.

TABLE 2

|  | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| First transparent base (Material/thickness μm) | PET/100 | PET/100 | PET/100 | PET/80 | PET/50 | PET/125 | PET/100 | PET/100 | PET/50 |
| Second transparent base (Material/thickness μm) | PET/100 | PET/100 | PET/100 | PET/80 | PET/50 | PET/125 | PET/100 | PET/100 | PET/50 |
| Green light-emitting particle | Cd-G1 | Cd-G2 | Cd-G3 | Cd-G3 | Cd-G3 | Cd-G3 | InP-G1 | Cd-G4 | Cd-G3 |
| Red light-emitting particle | InP-R1 | InP-R1 | InP-R1 | InP-R1 | InP-R1 | InP-R1 | InP-R1 | Cd-R1 | InP-R1 |
| Cadmium content in a quantum dot composition (ppm) | 592 | 1822 | 2533 | 2533 | 2533 | 2533 | 0 | 5335 | 2533 |
| Thickness of quantum dot layer (μm) | 80 | 80 | 80 | 40 | 80 | 100 | 80 | 100 | 125 |

Experimental Example

Evaluation of Properties of Light Conversion Sheet (1) Optical Properties

The quantum dot film was cut to A4 size, the cut films were mounted on the center part of the backlight of Samsung SUHD TV JS6500 model, and the power was applied, and then the luminance and the color reproduction range of 13 points were measured using a luminance meter (CS-2000, Minolta Co., Ltd.) and the average value is shown in Table 3 blew.

(2) Cadmium Content

The quantum dot film was cut to 10×10 cm, and then the cadmium content was measured using ICP-MS, and the cadmium content is shown in Table 3 below by 100 times the measured cadmium content.

TABLE 3

|  | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| Luminance (cd/m$^2$) | 761 | 796 | 776 | 771 | 821 | 768 | 650 | 899 | 862 |
| Color reproduction range (%) | 117.5 | 125.3 | 137.4 | 120.6 | 137.4 | 129.4 | 107.4 | 147.2 | 140.1 |
| (ppm) | 12 | 42 | 57 | 20 | 98 | 74 | N.D. | 154 | 176 |

DESCRIPTION OF SYMBOLS

| | |
|---|---|
| 1: Liquid crystal display | 10: Liquid crystal |
| 11: Lower polarizing film | 12: Upper polarizing film |
| 13: Lower display panel | 14: Upper display panel |
| 20: Reflection plate | 21: Light-emitting element |
| 22: Light guide plate | 23: Light conversion film |
| 24: Luminance enhancement film | 25: Reflective polarizer |
| 30: First transparent support layer | 31: First transparent support layer |
| 40: Matrix material | 41: Cadmium-containing quantum dot particles |
| 42: Cadmium-free quantum dot particles | 43: Scattering agent |
| 100: Liquid crystal display panel, | 200: Backlight unit |

The invention claimed is:

1. A light conversion film comprising a first transparent support layer formed on the upper surface of a quantum dot layer and a second transparent support layer formed on the lower surface thereof and having a thickness of 120 to 400 μm,
wherein the quantum dot layer comprises 0.4 to 2.0% by weight of quantum dot particles containing 5% by weight or more and less than 35% by weight of cadmium; 0.05 to 0.75% by weight of cadmium-free quantum dot particles; 0.1 to 10% by weight of scattering agent; and 75 to 98% by weight of matrix material, based on the total weight of the quantum dot layer, and
wherein the cadmium content in the film is 10 to 100 ppm.

2. The light conversion film according to claim 1, characterized in that the quantum dot particles containing 5% by weight or more and less than 35% by weight of cadmium have a maximum absorption wavelength of 525 to 540 nm, and the cadmium-free quantum dot particles have a maximum absorption wavelength of 625 to 640 nm.

3. The light conversion film according to claim 1, characterized in that the quantum dot particles containing 5% by weight or more and less than 35% by weight of cadmium have a full width at half maximum of 20 to 30 nm, and the cadmium-free quantum dot particles have a full width at half maximum of 35 to 50 nm.

4. The light conversion film according to claim 3, characterized in that the quantum dot particles containing 5% by weight or more and less than 35% by weight of cadmium have an average particle diameter of 2.0 to 4.0 nm, and the cadmium-free quantum dot particles have an average particle diameter of 5.0 to 7.0 nm.

5. The light conversion film according to claim 1, characterized in that the quantum dot particles containing 5% by weight or more and less than 35% by weight of cadmium contain 0.1 to 4.5 moles of one or more selected from Groups II and III elements other than cadmium and contain 0.5 to 6.0 moles of one or more selected from Groups V and VI elements, based on 1 mole of cadmium.

6. The light conversion film according to claim 1, characterized in that the cadmium-free quantum dot particles contain 0.2 to 4.0 moles of one or more selected from Groups V and VI elements, based on 1 mole of one or more selected from Groups II and III elements other than cadmium (Cd).

7. The light conversion film according to claim 1, characterized in that the cadmium content in the quantum dot layer is 400 to 3000 ppm.

8. The light conversion film according to claim 1, characterized in that the quantum dot layer has a thickness of 20 to 100 μm, and the first transparent support layer and the second transparent support layer each independently have a thickness of 50 to 150 μm.

9. The light conversion film according to claim 1, characterized in that the matrix material comprises one or more (meth)acrylate-based compounds and one or more photoinitiators.

10. The light conversion film according to claim 9, characterized in that the (meth)acrylate-based compound is one or more selected from the group consisting of a (meth)acrylated monomer, an urethane (meth)acrylate oligomer, a polyester (meth)acrylate oligomer, and an epoxy (meth)acrylate oligomer.

11. The light conversion film according to claim 9, characterized in that the matrix material further comprises a polythiol-based compound.

12. A backlight unit for a display device comprising the light conversion film of claim 1.

13. The backlight unit for a display device according to claim 12, characterized in that the backlight unit for a display device comprises a light guide plate, a reflection plate disposed under the light guide plate, a plurality of light-emitting elements disposed on one side of the light guide plate, a light conversion film disposed on the upper of the light guide plate, and a luminance enhancement film disposed on the upper of the light conversion film.

14. The backlight unit for a display device according to claim 13, characterized in that the light-emitting element is a blue light-emitting diode.

15. A composition for forming a quantum dot layer, characterized in that the quantum dot layer comprises:
(a) 0.4 to 2% by weight of cadmium-containing quantum dot particles having a cadmium (Cd) content of 5% by weight or more and less than 35% by weight;
(b) 0.05 to 0.75% by weight of cadmium-free quantum dot particles;
(c) 75 to 98% by weight of matrix material; and
(d) 0.1 to 10% by weight of scattering agent,
wherein the cadmium-containing quantum dot particles having a cadmium (Cd) content of 5% by weight or more and less than 35% by weight have a maximum absorption wavelength of 525 to 540 nm, and
wherein the cadmium-free quantum dot particles have a maximum absorption wavelength of 625 to 640 nm.

16. The composition for forming a quantum dot layer according to claim 15, characterized in that the matrix material comprises one or more (meth)acrylate-based compounds, a polythiol-based compound, and one or more photoinitiators.

17. The composition for forming a quantum dot layer according to claim 16, characterized in that the matrix material comprises the (meth)acrylate-based compound, the polythiol-based compound, and the one or more photoinitiators in a weight ratio of 30 to 70:10 to 50:1 to 6.

18. The composition for forming a quantum dot layer according to claim 15, characterized in that the composition for forming a quantum dot layer has a cadmium content of 400 to 3000 ppm.

19. The composition for forming a quantum dot layer according to claim 15, characterized in that (a) the quantum dot particles having a cadmium (Cd) content of 5% by weight or more and less than 35% by weight are green light-emitting particles and have a maximum absorption wavelength of 525 to 540 nm, a full width at half maximum of 20 to 30 nm, and a quantum yield of 90% to 99%, and (b) the cadmium-free quantum dot particles are red light-emitting particles and have a maximum absorption wavelength of 625 to 640 nm, a full width at half maximum of 35 to 50 nm, and a quantum yield of 70% to 85%.

* * * * *